United States Patent
Bailey et al.

(10) Patent No.: US 10,178,794 B1
(45) Date of Patent: Jan. 8, 2019

(54) FLEXIBLE UTILITY ROOM CONFIGURATION WITH INTERCHANGEABLE INTERFACE PANEL

(71) Applicant: DELL PRODUCTS, L.P., Round Rock, TX (US)

(72) Inventors: Mark M. Bailey, Round Rock, TX (US); Tyler B. Duncan, Austin, TX (US); Trey S. Wiederhold, Cedar Park, TX (US); Ty R. Schmitt, Round Rock, TX (US); Anthony P. Middleton, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/960,387

(22) Filed: Apr. 23, 2018

(51) Int. Cl.
| | |
|---|---|
| *H05K 7/20* | (2006.01) |
| *H05K 7/14* | (2006.01) |
| *E04H 5/02* | (2006.01) |
| *H02G 3/38* | (2006.01) |
| *E04H 5/00* | (2006.01) |

(52) U.S. Cl.
CPC ............. *H05K 7/1497* (2013.01); *E04H 5/02* (2013.01); *H02G 3/283* (2013.01); *H05K 7/1491* (2013.01); *H05K 7/1492* (2013.01); *E04H 2005/005* (2013.01); *H05K 7/20745* (2013.01)

(58) Field of Classification Search
CPC .................................................... H05K 7/1497
See application file for complete search history.

(56) References Cited

U.S. PATENT DOCUMENTS

| | | | |
|---|---|---|---|
| 7,644,051 B1 * | 1/2010 | Moore | G05B 13/027 706/16 |
| 8,514,572 B2 * | 8/2013 | Rogers | H05K 7/20745 361/695 |
| 9,237,681 B2 * | 1/2016 | Slessman | H05K 7/20745 |
| 9,310,855 B2 | 4/2016 | Godrich et al. | |
| 9,345,173 B2 | 5/2016 | Czamara et al. | |
| 9,510,485 B2 | 11/2016 | Schmitt et al. | |
| 2009/0229194 A1 * | 9/2009 | Armillas | E04H 1/1205 52/79.1 |
| 2011/0023388 A1 * | 2/2011 | Tong | E04H 5/02 52/173.1 |
| 2012/0200206 A1 | 8/2012 | Schmitt et al. | |

(Continued)

*Primary Examiner* — Anthony Q Edwards
(74) *Attorney, Agent, or Firm* — Isidore PLLC

(57) ABSTRACT

A modular utility room a mobile enclosure is positionable adjacent to an information technology (IT) enclosure of a modular data center (MDC). One of a first and second equipment cabinet is selected for installing in the mobile enclosure. Each equipment cabinet contains functional equipment having a lower electrical coupling component that are connectable to substrate-installed conduits below the mobile enclosure and an upper electrical coupling component that connect to and support rack-based information handling systems (IHSs) in the IT enclosure. An interface panel is received in an interface panel opening in the mobile enclosure correspond to the selected equipment cabinet and will not receive the other equipment cabinet. The interface panel positions the lower electrical coupling over a conduit opening in alignment with a defined location relative to the mobile enclosure for alignment with the substrate-installed conduits at a deployed location of the mobile utility room.

17 Claims, 16 Drawing Sheets

(56) References Cited

U.S. PATENT DOCUMENTS

| | | | |
|---|---|---|---|
| 2013/0199032 A1* | 8/2013 | Czamara | H05K 7/1497 29/825 |
| 2013/0232888 A1* | 9/2013 | Crosby, Jr. | E04H 1/00 52/79.8 |
| 2016/0302324 A1* | 10/2016 | Rogers | E04B 1/343 |
| 2017/0105310 A1 | 4/2017 | Chen | |

\* cited by examiner

FLEXIBLE UTILITY ROOM CONFIGURATION WITH INTERCHANGEABLE INTERFACE PANEL

BACKGROUND

1. Technical Field

The present disclosure relates in general to support structures of an information handling system (IHS), and more particularly to floor mount support structures for enclosures of an IHS incorporated in a modular data center (MDC).

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Large-scale IHSs (LIHSs) are often deployed as a modular data center (MDC) comprising different interconnected modular units. Each modular unit is configured at an original equipment manufacturer (OEM) and shipped to a deployed location. With a MDC deployment, IHSs and support infrastructure such as communication networking, power distribution, and cooling systems can be rapidly shipped to an operation destination and connected to substrate-installed power and communication conduits. At the deployed location, MDC pads are prepared to receive particular modular units that have external functional connections such as to power and communication conduits. MDC pads and modular units need to be correspondingly configured so that proper placement is provided at setup. Due to large number of possible configurations of MDCs, however, significant efforts must be made to ensure that information technology (IT) equipment that supports the IHSs are accurately installed in the MDCs. Otherwise, connection points to the IT equipment may be displaced from pre-positioned substrate-installed conduits and conductors of an assigned MDC pad at the deployed location. Incorrectly selected equipment in the MDC can delay operations by requiring separate shipping of the correct equipment to the deployed location.

BRIEF SUMMARY

In accordance with the teachings of the present disclosure, a configurable modular data center (MDC) includes a volumetric structure. A floor assembly is mounted across a bottom portion of the volumetric structure and includes an interface panel opening capable of receiving a plurality of different configurations of interface panels. A first interface panel is received in the interface panel opening. The first interface panel has a first configuration of at least one conduit opening and an array of attachment features. A first equipment cabinet of more than one type of equipment cabinet contains functional equipment that provide support for one or more information technology (IT) equipment, such as rack-based information handling systems (IHSs). The first equipment cabinet positions a lower electrical coupling component of the functional equipment for connection to a substrate-installed conduit at a deployed location of the configurable MDC. The first equipment cabinet has a bottom surface that engagingly corresponds to the array of attachment features of the first interface panel. The array of attachment features align the lower electrical coupling component of the first equipment cabinet according to a defined location relative to the volumetric structure. The predefined location corresponds to the substrate-installed conduit of a MDC pad at the deployed location of the configurable MDC. The one or more substrate-installed conduits are prepositioned according to a first placement of more than one predefined placements.

According to aspects of the present innovation, a modular utility room includes a volumetric structure configured with enclosure panels to form a mobile enclosure. The volumetric structure is positionable adjacent to an information technology (IT) enclosure of a modular data center (MDC). A floor assembly is mounted across a bottom portion of the volumetric structure and includes an interface panel opening that selectively receives a selected one of a first and second equipment cabinet containing functional equipment and having a lower electrical coupling component that connects to substrate-installed conduits below the volumetric structure. The functional equipment includes an upper electrical coupling component that connects to and supports IT equipment, such as rack-based information handling systems (IHSs), in the IT enclosure. A selected one of a first and a second interface panel is received in the interface panel opening. The first and second panels have a respective first and second configuration of at least one conduit opening and an array of attachment features. The first and second configurations are uniquely arranged to receive and correspond to a bottom surface of the respective first and second equipment cabinets. The array of attachment features position the lower electrical coupling component over one of the at least one conduit opening in alignment with a defined location relative to the volumetric structure. The predefined location corresponds to the one or more substrate-installed conduits of a MDC pad at the deployed location of the mobile utility room. The one or more substrate-installed conduits are prepositioned according to a selected one of a first and second placement that correspond respectively to the first and second configurations.

According to illustrative embodiments of the present disclosure, a method is provided for providing a modular data center having interchangeable base plates that accommodate IT equipment of different sizes and types. In one or more embodiment, the method includes attaching a floor assembly mounted across a bottom portion of a modular enclosure and comprising an interface panel opening to form a volumetric structure of a modular data center (MDC). The method includes installing a selected one of a first and a second interface panel received in the interface panel opening. The first and second interface panels have an array of attachment features and a respective first and second configuration of at least one conduit opening at defined location(s) relative to the volumetric structure. The first and second configurations are uniquely arranged to receive and correspond to a bottom surface of a respective first and second equipment cabinets. The predefined location corresponds to the one or more substrate-installed conduits of a MDC pad at the deployed location of the mobile utility room. The one or more substrate-installed conduits are prepositioned according to a selected one of a first and second placement that correspond respectively to the first and second configurations. The method includes positioning the selected one of a first and second equipment cabinet on the corresponding selected one of the first and second interface panel. A lower electrical coupling component of functional equipment contained in the selected one of the first and second equipment cabinet is thereby positioned at the predefined location. The method includes attaching the selected one of a first and second equipment cabinet to the array of attachment features.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
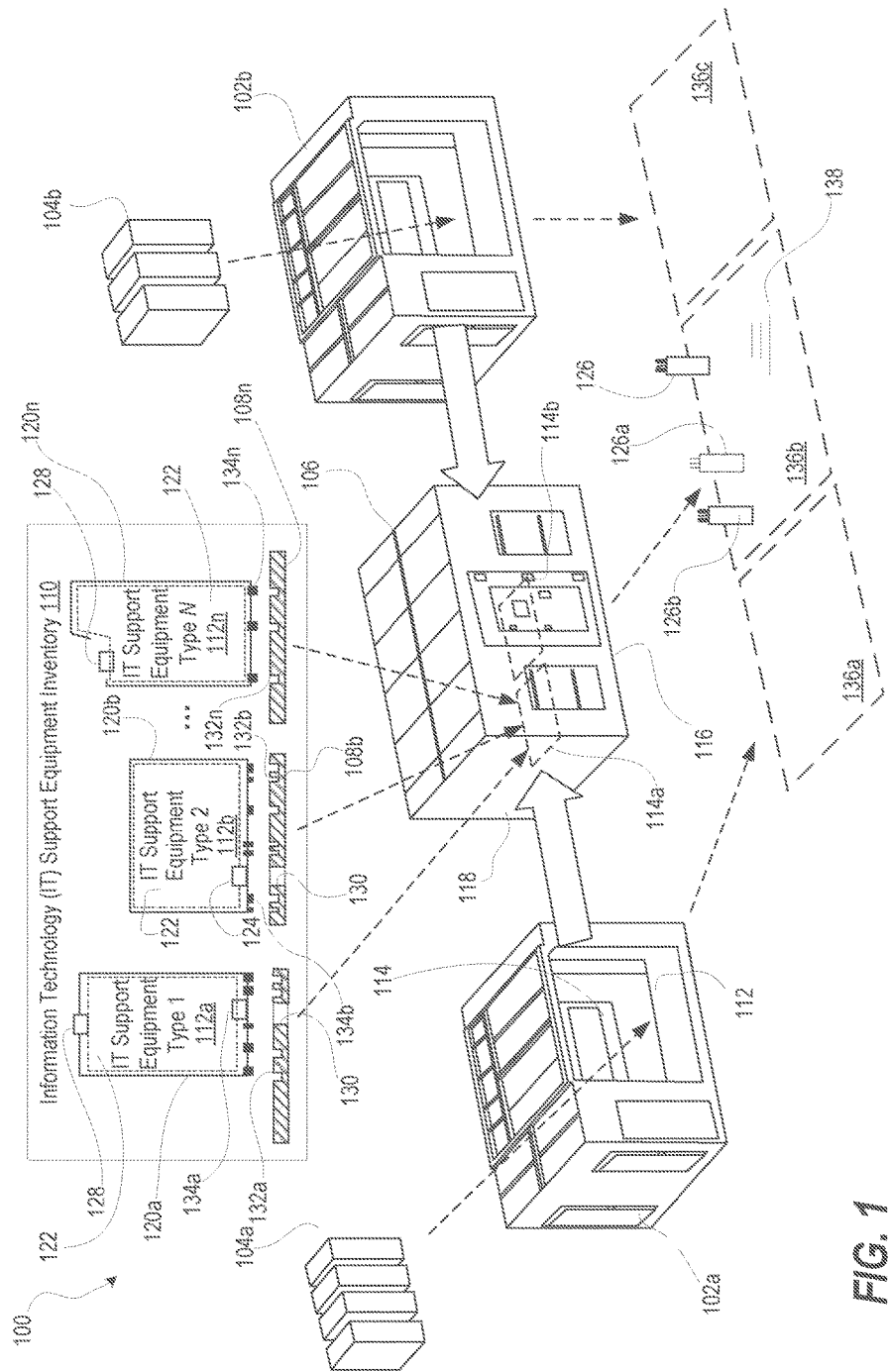
FIG. 1 is an isometric, exploded, three dimensional (3D) depiction of an example large-scale information handling system (IHS) configured as a modular data center (MDC) having a modular utility room and information technology (IT) enclosures, according to one or more embodiments.

According to aspects of the present innovation, a modular utility room has a volumetric enclosure supporting different selectable configurations of interior components. The utility room is positionable adjacent to one or more information technology (IT) enclosures of a modular data center (MDC). One of a first and second equipment cabinet is selected for installing in the utility room enclosure. Each equipment cabinet contains functional equipment having one or more lower electrical coupling components that are connectable to substrate-installed conduits below the mobile enclosure and an upper electrical coupling component that connects to and supports IT equipment, such as rack-based information handling systems (IHSs), in the IT enclosure. An interface panel correspond to the selected equipment cabinet is received in an interface panel opening in the mobile enclosure. The interface panel positions the lower electrical coupling over a conduit opening in alignment with a defined location relative to the mobile enclosure for alignment with the substrate-installed conduits at a deployed location of the mobile utility room. In one or more embodiments, a common utility room can thus interface to multiple different power, network, and IT configurations, with the availability of correspondingly configured and interchangeable panels.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others.

Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 is an isometric exploded three dimensional (3D) depiction of example modular data center (MDC) 100 having a plurality of information technology (IT) modules 102a-102b that are selectably configured with different types of rack-based information handling systems (IHSs) 104a-104b. Utility room 106 contains structures and equipment that functionally support MDC 100, including communication network connections and power distribution connections within MDC 100 and/or to sources outside of MDC 100. In the presented embodiment, MDC 100 is and/or is configured as an Expandable Modular Information Technology Building Infrastructure (EMITBI). Further, because of the relatively large scale of MDC 100 and the use of modular building blocks that provides the IT modules 102a-102b and utility room 106 are collectively referred to herein as a modularly-constructed, large-scale information handling system (LIHS). Within the general context of IHSs, rack-based IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communication between the various hardware components.

MDC 100 is customized and upgradeable to meet particular customer requirements by selecting types and numbers of rack-based IHSs 104a-104b. The number of IT modules 102a-102b can then be determined with this selection. In addition, support requirements provided by other modular enclosures can also be determined based on this selection. Utility room 106 supports flexible configuration for these customized support requirements. Interchangeable interface panels 108a, 108b, 108n can be selected from an inventory 110 of IT support equipment 112a, 112b, 112n that are adapted for multiple sizes of power distribution gear and networking gear that needs to be accounted for. Each interchangeable interface panel 108a, 108b, 108n has a unique configuration with regard to mounting of a corresponding one IT support equipment 112a, 112b, 112n but all interchangeable interface panel 108a, 108b, 108n fit within a selected interface panel opening 114a-114b of utility room 106. Utility room 106 has a floor assembly 116 mounted across a bottom portion of a volumetric structure 118.

Each IT support equipment 112a, 112b, 112n includes a unique equipment cabinet 120a, 120b, 120n containing functional gear 122. Functional gear 122 can have lower electrical coupling component(s) 124 that connect to substrate-installed conduits 126 below the volumetric structure 118. Functional gear 122 can have upper electrical coupling component(s) 128 that connect to and support rack-based IHSs 104a-104b in the IT enclosures 102a-102b. IT support equipment 112a is an example of an input cabinet having lower electrical coupling component(s) 124 and no upper electrical coupling component(s) 128. IT support equipment 112b is an example of an output cabinet having upper electrical coupling component(s) 128 and no lower electrical coupling component(s) 124. IT support equipment 112n is an example of an input/output cabinet having both lower and upper electrical coupling component(s) 124, 128. Terms "Input" and "Output" are adopted as a convention based on a functional relationship of power distribution IT support equipment.

Interface panels 108a-108b are respectively of first and second configurations of at least one conduit opening 130 and an array of attachment features 132. First and second configurations are uniquely arranged to receive and correspond to a respective bottom surface 134a, 134b of the respective first and second equipment cabinets 120a, 120b. Interface panels 108a-108b position lower electrical coupling component(s) 124 over one of the at least one conduit opening 130 in alignment with a defined location relative to the volumetric structure 118. Interface panel 108n lacks a conduit opening 130 but positions upper electrical coupling component(s) 128. The predefined location corresponds to the one or more substrate-installed conduits 126 of a MDC pad 136b at a deployed location 138 of the utility room 106 between MDC pads 136a, 136c for IT modules 102a-102b. Substrate-installed conduit(s) 126 are pre-positioned according to a selected one of a first and second placement that correspond respectively to the first and second configurations. For example, an alternately positioned conduit 126a could work with a different configuration that an appropriately positioned conduit 126b. MDC pads 136a-136c can have a supporting substrate 138 of cleared ground, gravel, concrete, etc.

Figure 2A:
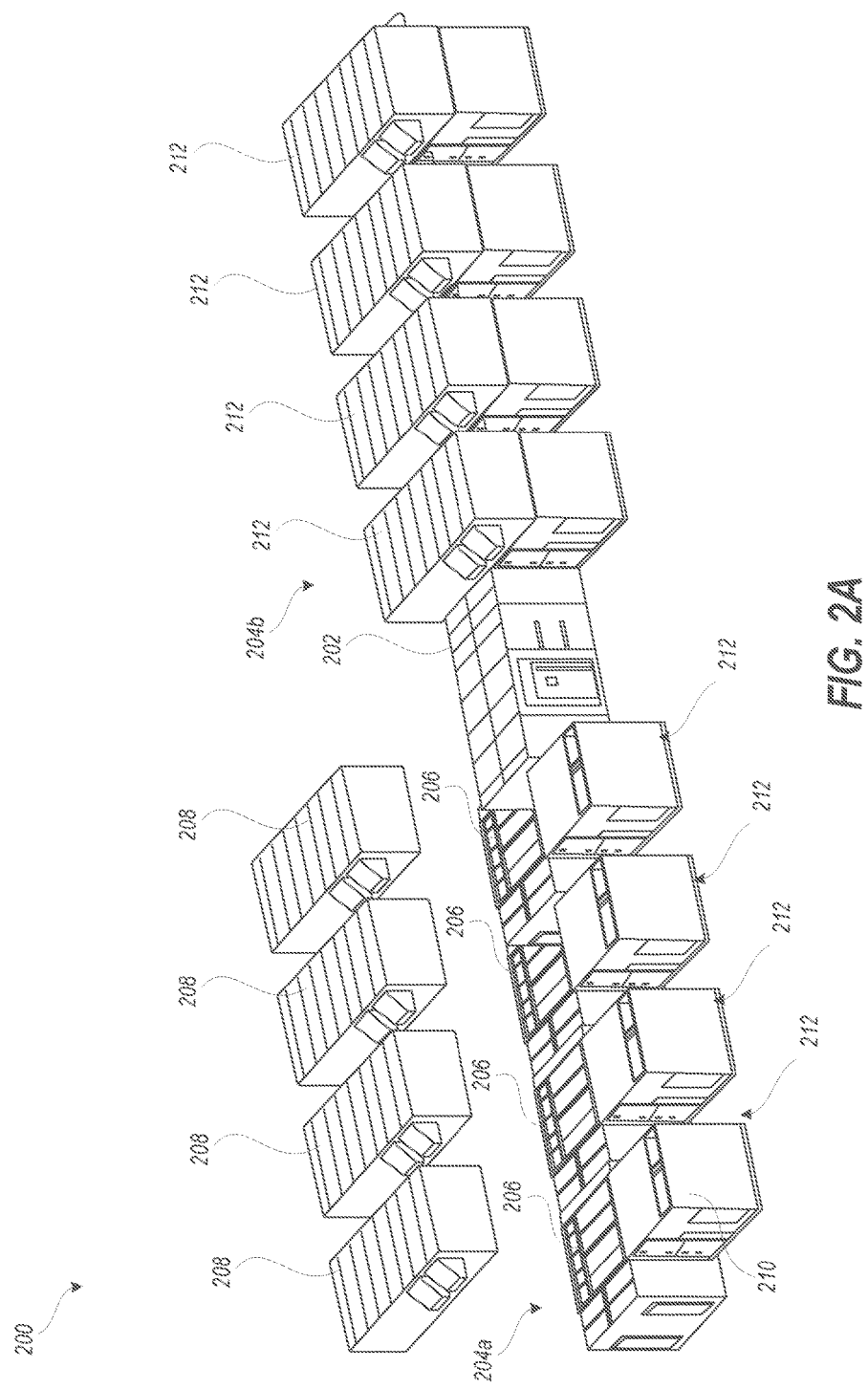
FIG. 2A is an isometric view of an example MDC of a utility room inserted between two groups of IT enclosures and air handling units (AHUs), according to one or more embodiments.

FIG. 2A is an isometric, view illustrating an example MDC 200 having a utility room 202 inserted between two groups 204a, 204b of IT enclosures 206. Modular cooling systems 208 are positioned to cool the IT modules 206 including upper and lower portions 208, 210 of an air handling unit (AHU) 212 that provides cooling air flow to racked-based IHSs 104a-104b (FIG. 1) housed within IT modules 206. Lower portion 210 can provide mechanical cooling such as via direct expansion (DX), evaporation, liquid chiller, etc. Upper portion 208 can provide return air exhaust and recirculation for mixing with cooling air from lower portion 210.

Utility room 202 connects groups 204a, 204b of IT enclosures 206. In one embodiment, utility room 202 is provided to support expansion of a base MDC (e.g., left side structures of MDC 200 containing group 204a of IT modules 206). For clarity, four (4) added IT enclosures 206 are supported by utility room 202, although utility room 202 can be placed adjacent to and support various combinations of IT modules 206. For example, utility room 202 can support one IT enclosure 206 that contains rack-based IHSs racked-based IHSs 104a-104b (FIG. 1). For clarity, support functions of utility room 202 are separated from IT modules 206. In one or more embodiments, aspects of the present disclosure include combining features of both utility room 202 and IT enclosures 206 into a single enclosure. Thus, an interface panel can provide a common framework for configuring various kinds of MDC enclosures. Support equipment for power and communication can be installed within an enclosure that includes rack-based IHSs 104a-104b (FIG. 1).

Figure 2B:
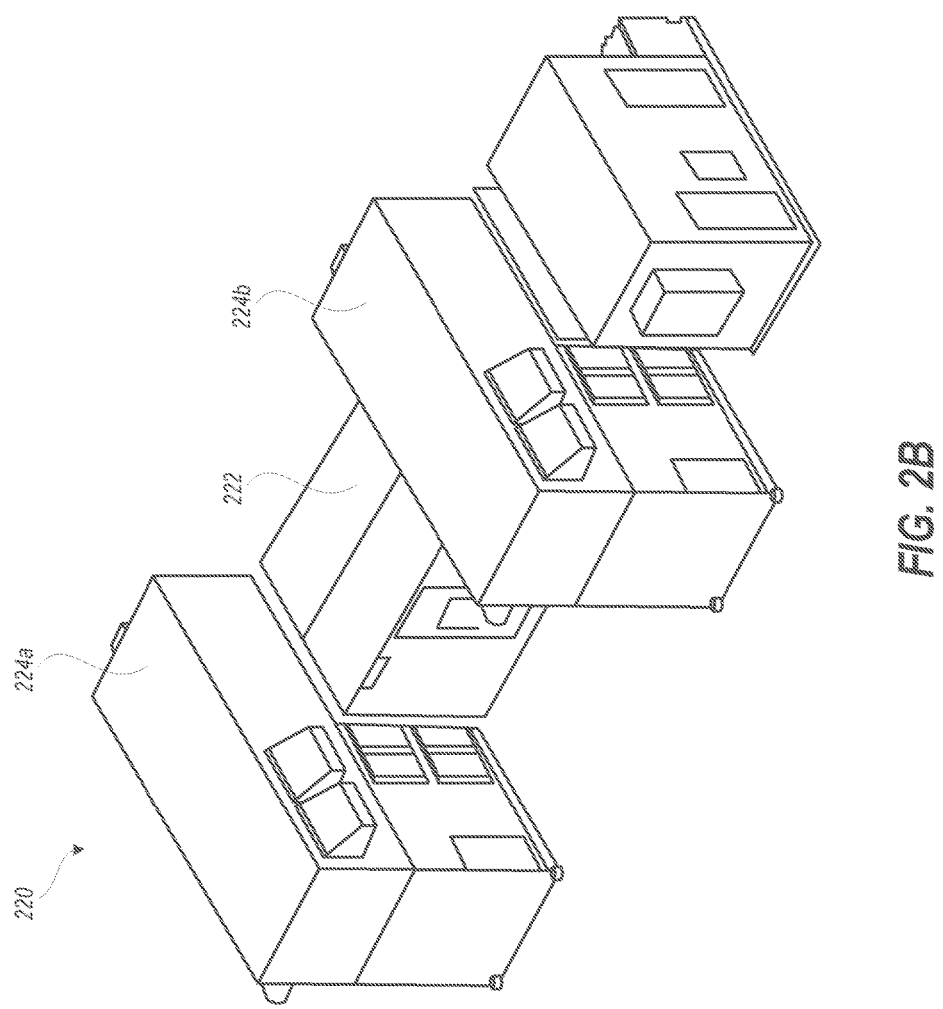
FIG. 2B is an isometric view of an example MDC having a utility room connected between two IT modules with AHUs, according to one or more embodiments.
Figure 2C:
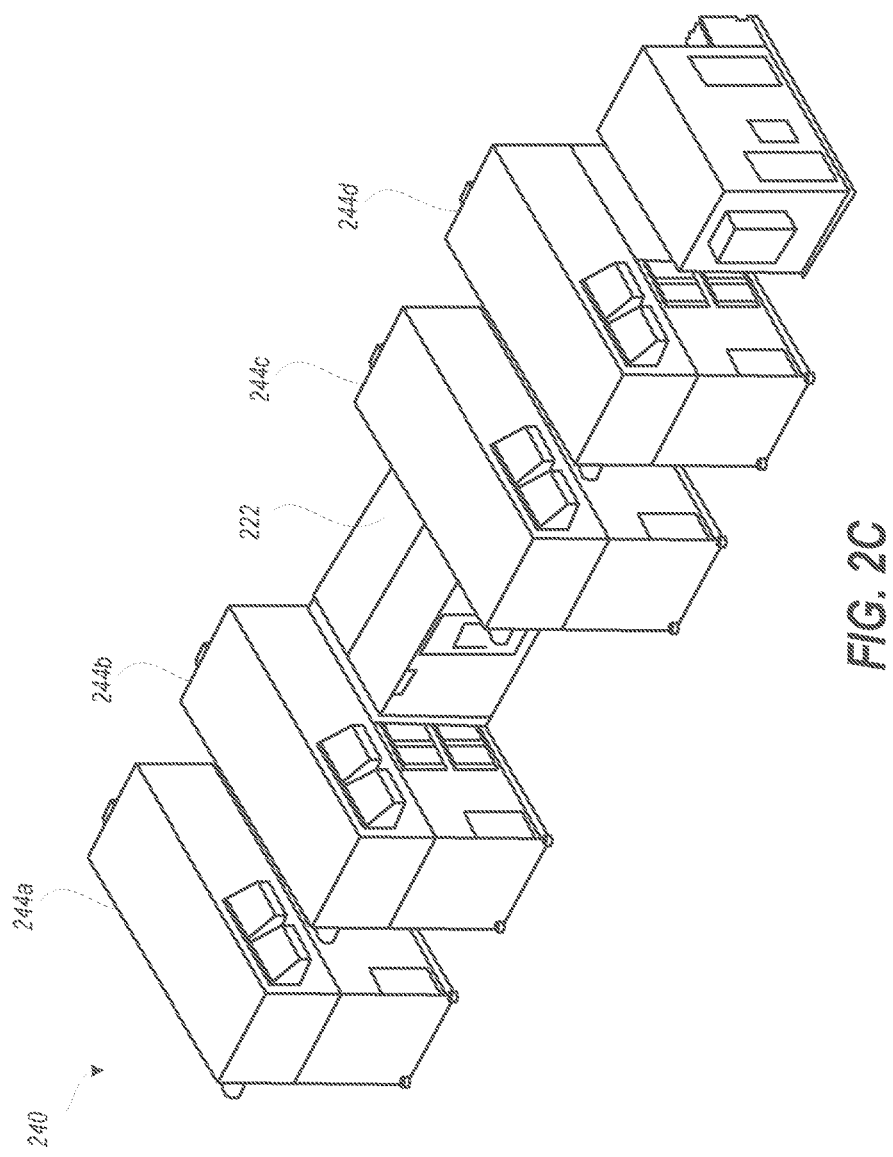
FIG. 2C is isometric view of an example MDC having a utility room connected between two pairs of IT modules, according to one or more embodiments.

FIG. 2B is isometric view of an example MDC 220 having a utility room 222 connected between two IT/AHU modules 224a-224b. FIG. 2C is isometric view illustrating an example MDC 240 having a utility room 242 connected between two pairs of IT/AHU modules 244a-244d, such as after upgrading MDC 220 (FIG. 2B).

Figure 3A:
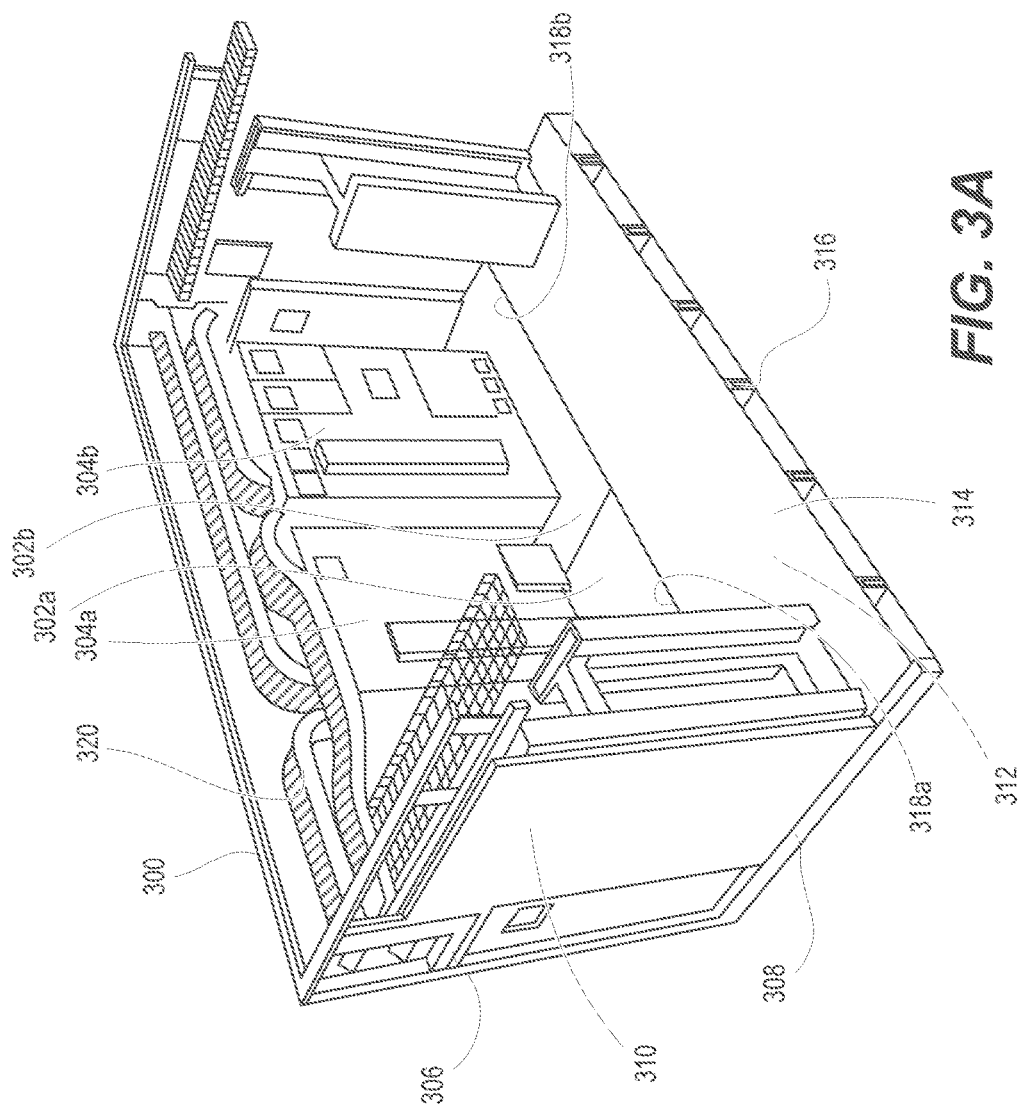
FIG. 3A is a cutaway isometric view of an example utility room having interchangeable interface panels for efficiently configuring equipment cabinets, according to one or more embodiments.
Figure 3B:
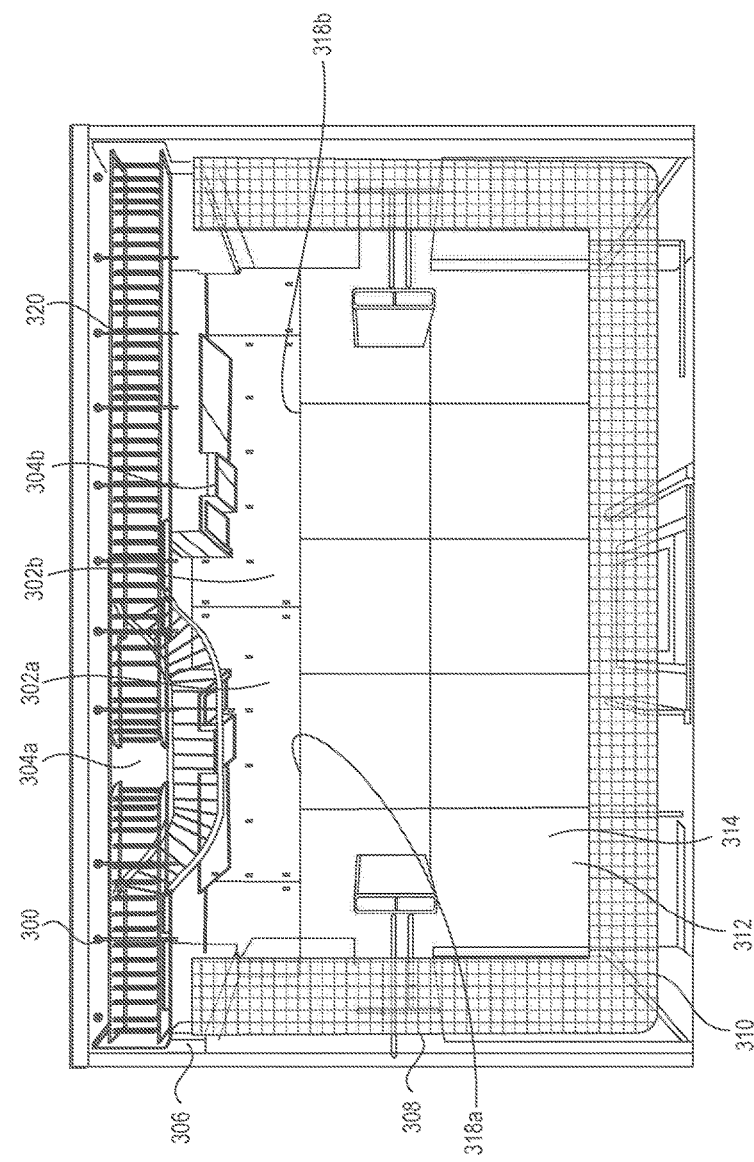
FIG. 3B is a cutaway top isometric view of the example utility room, according to one or more embodiments.

FIGS. 3A-3B illustrate an example modular utility room 300 having interchangeable interface panels 302a, 302b for efficiently configuring equipment cabinets 304a, 304b, respectively. With particular reference to FIG. 3A, modular utility room 300 includes housing 306 that defines volumetric structure 308 that is enclosed with enclosure panels 310. Referring now to both FIGS. 3A-3B, floor assembly 312 is mounted across a bottom portion of volumetric structure 308. One portion of floor assembly 312 has a floor surface 314 supported on structural supports such as parallel arranged beams 316. Left and right interface panel openings 318a, 318b are adjacent to the floor surface 314. Left and right interface panel openings 318a, 318b are equally sized rectangular openings that receive respectively first and second interface panels 304a, 304b. Cable brackets 320 located above equipment cabinets 304a, 304b provide pathways for output cables from equipment cabinets 304a, 304b.

Figure 4:
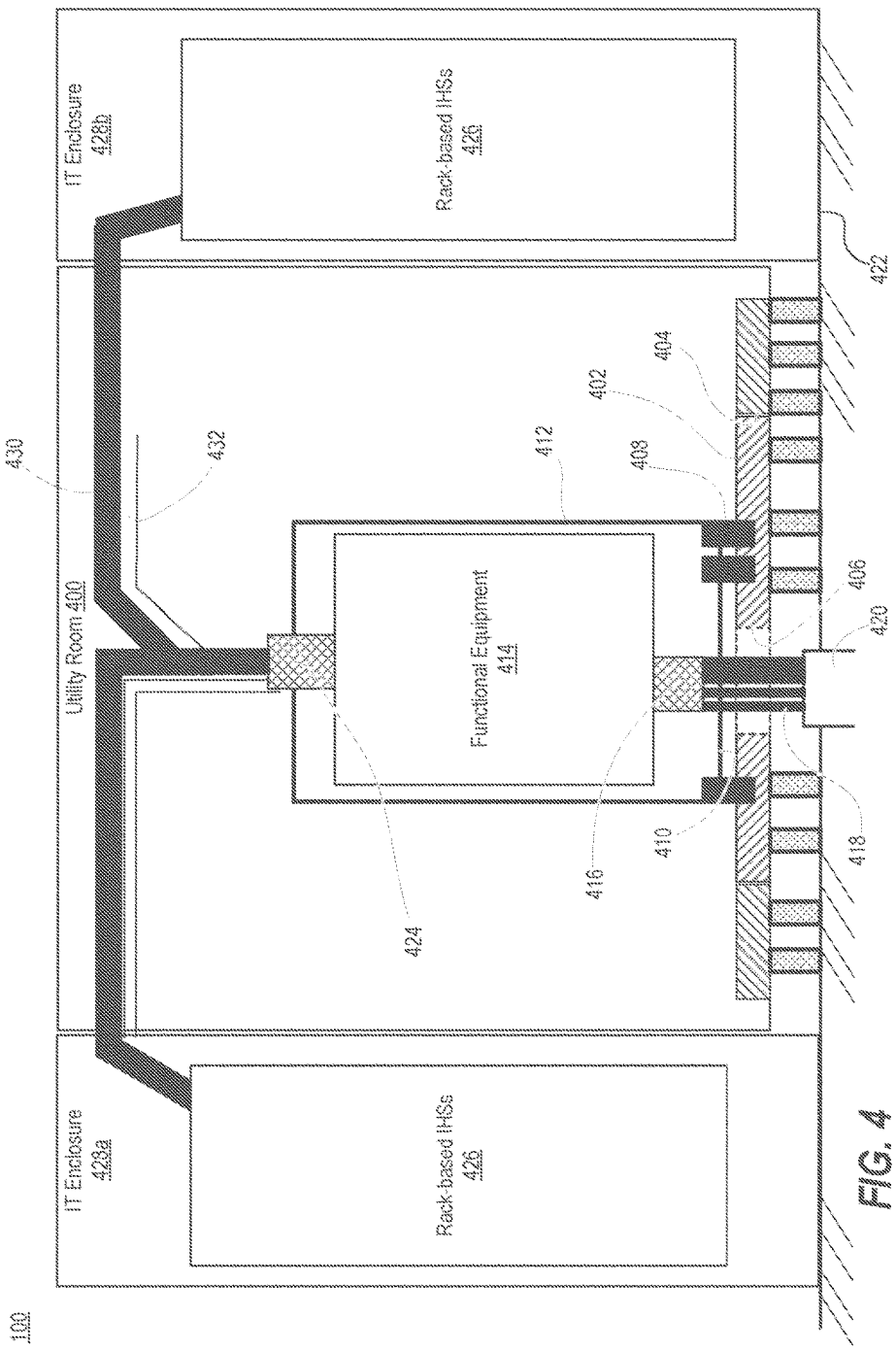
FIG. 4 is a simplified side view diagram of a utility room having a first interface panel received in an interface panel opening, according to one or more embodiments.

FIG. 4 is a simplified side view diagram of a utility room 400 of MDC 100 having a first interface panel 402 received in an interface panel opening 404. First interface panel 402 is arranged according to a first configuration with a conduit opening 406. An array of attachment features 408 of first interface panel 402 uniquely correspond to a bottom surface 410 of a first equipment cabinet 412. First equipment cabinet 412 contains functional equipment 414 having a lower electrical coupling component 416 that connect to conductors 418 exposed from a substrate-installed conduit 420 prepositioned in MDC pad 422. Substrate can be cleared ground covered in gravel or concrete or other foundations. Functional equipment 414 has an upper electrical coupling component 424 that enables connection of electrical and communication cables 430 which connect to and support rack-based IHSs 426 in one or more IT enclosures 428 of MDC 100. Cable(s) 430 are supported by cable bracket 432. First interface panel 402 ensure that a correct equipment cabinet is installed in a proper location for positioning the lower electrical coupling component 416 above the conduit opening 406 and the substrate-installed conduit 420. Structural supports 434 attached beneath a top plate 436 of the first interface panel 402 are positioned adjacent to the conduit opening 406.

Figure 5A:
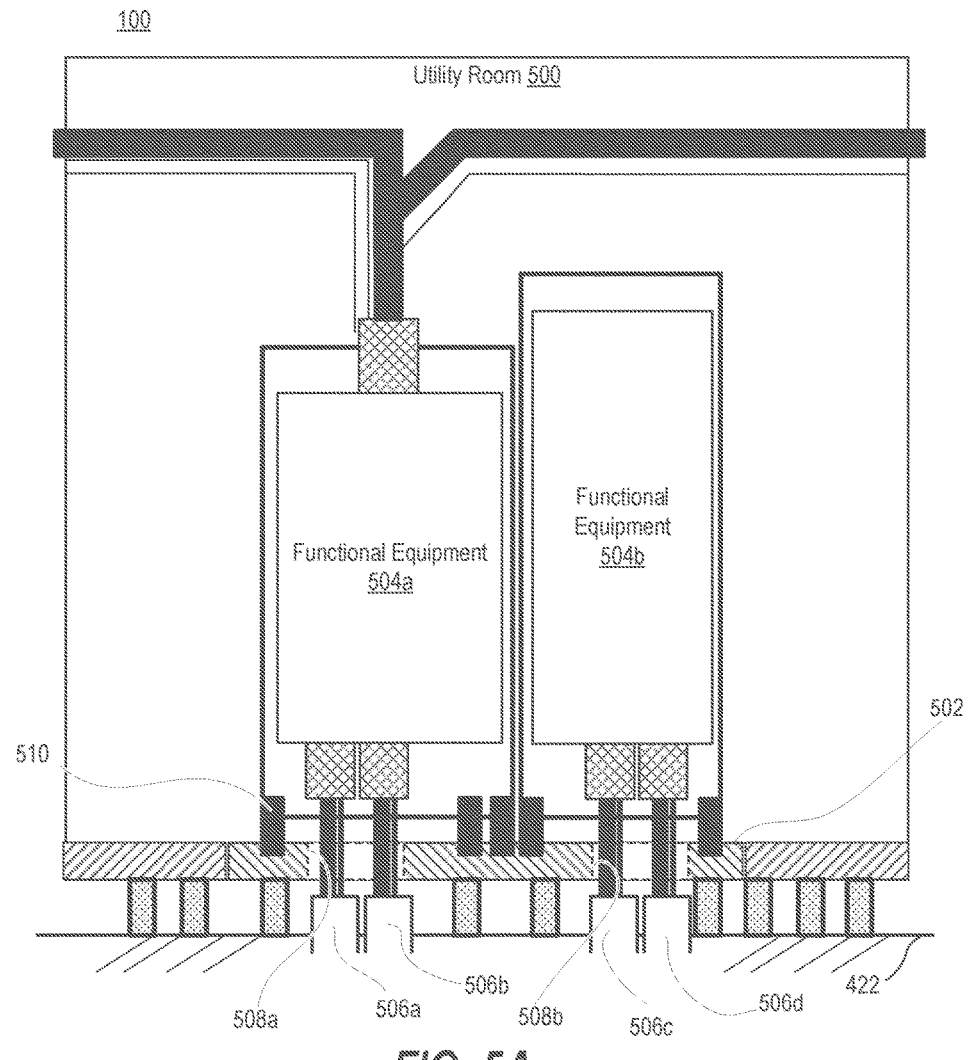
FIG. 5A is a cross sectional view illustrating a first example interface panel supporting two cabinets connected to substrate-installed conduits, according to one or more embodiments.

FIG. 5A illustrates a cutaway cross sectional view of utility room 500 having first example interface panel 502 supporting two input cabinets 504a, 504b connected to substrate-installed conduits 506a-506d through conduit openings 508a-508b. As a convention, substrate-installed conduits below utility room 500 are referred to as inputs, which is particularly apt for power conductors. Substrate-installed conduits for communication typically are bi-directional, but the same usage is made for convenience. Connections out of equipment cabinets and within MDC 100 are made upward to cable brackets or busways in an upper portion of utility room 500. Referring to these connections as outputs again is particularly apt for power distribution. Although not depicted, internal connections between equipment cabinets can be provided. In one or more embodiments, an input cabinet has an input but no upward output. An adjacent output cabinet has an upward output but no input from substrate-installed conduits. Power or communication or other functional connections can exist between the adjacent input and output cabinets to allow transfer of power from the ground-installed conduit, through utility room 500 and on to one or more supported IT modules.

Figure 5B:
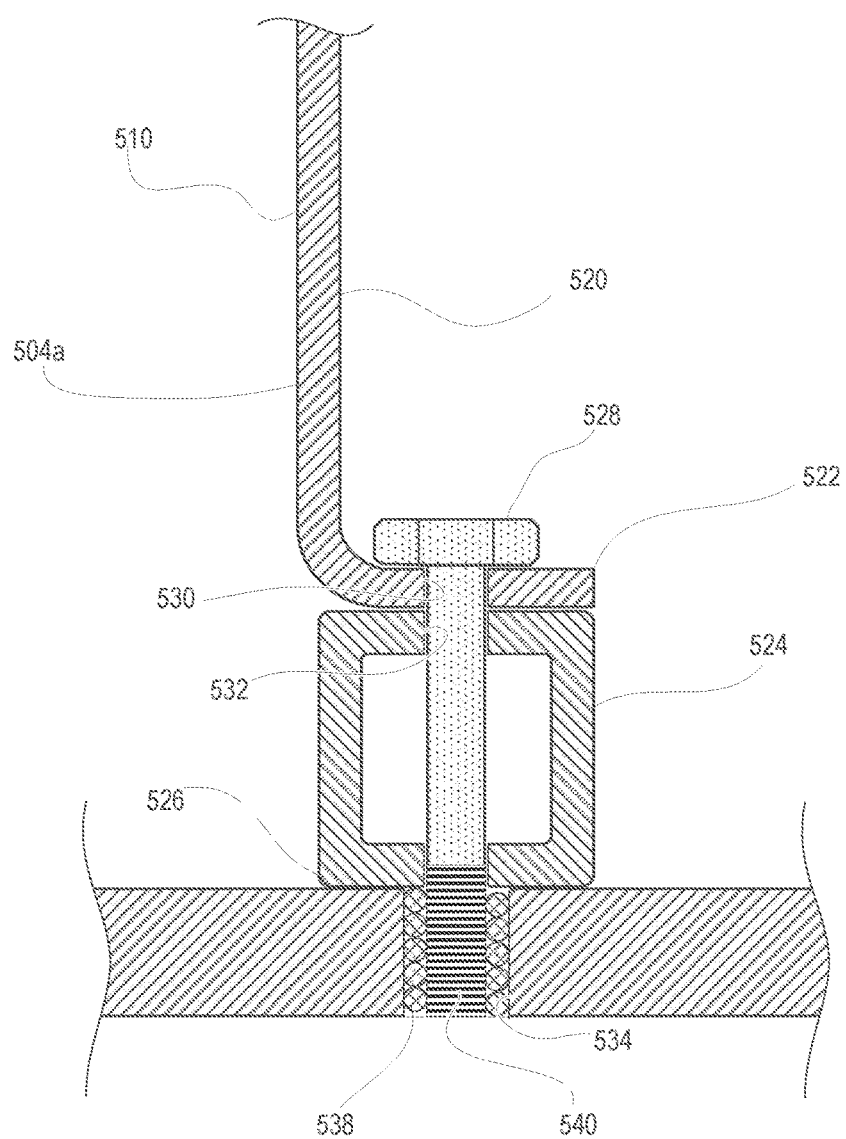
FIG. 5B is a cross sectional detail view illustrating a seismic attachment assembly, according to one or more embodiments.

FIG. 5B is a cross sectional detail view illustrating seismic attachment assembly 510. Equipment cabinets 504a, 504b (FIG. 5A) have lateral sides 520 whose bottom edge is an inwardly turned horizontally flanged surface 522 that rests upon an enclosure frame 524 of rectangular cross section. The combination of the horizontal flanged surface 522 and enclosure frame 524 form a bottom surface 526 of the equipment cabinets 504a, 504b (FIG. 5A). In one or more embodiments, the array of attachment features of first interface panel 502 is provided by a pattern of seismic bolt fasteners 528 that a pass through aligned vertical bolt holes 530, 532, 534 respectively through horizontal flanged surface 522, enclosure frame 524, and top plate 536 of first interface panel 502. Helicoil 538 in bolt hole 534 in top plate 536 engages a threaded end 540 of seismic bolt fastener 528. In one or more embodiments, bolt hole 534 includes female threads to engage threaded end 540 of seismic bolt fastener 528. Seismic attachment assembly 510 attaches each input cabinet 504a, 504b to first example interface panel 502. In the event of significant seismic activity, the seismic attachment assembly 502 absorbs an amount of seismic activity without full failure of the seismic attachment assembly 502. Cabinets 504a, 504b may sway but do not topple over.

Figure 6:
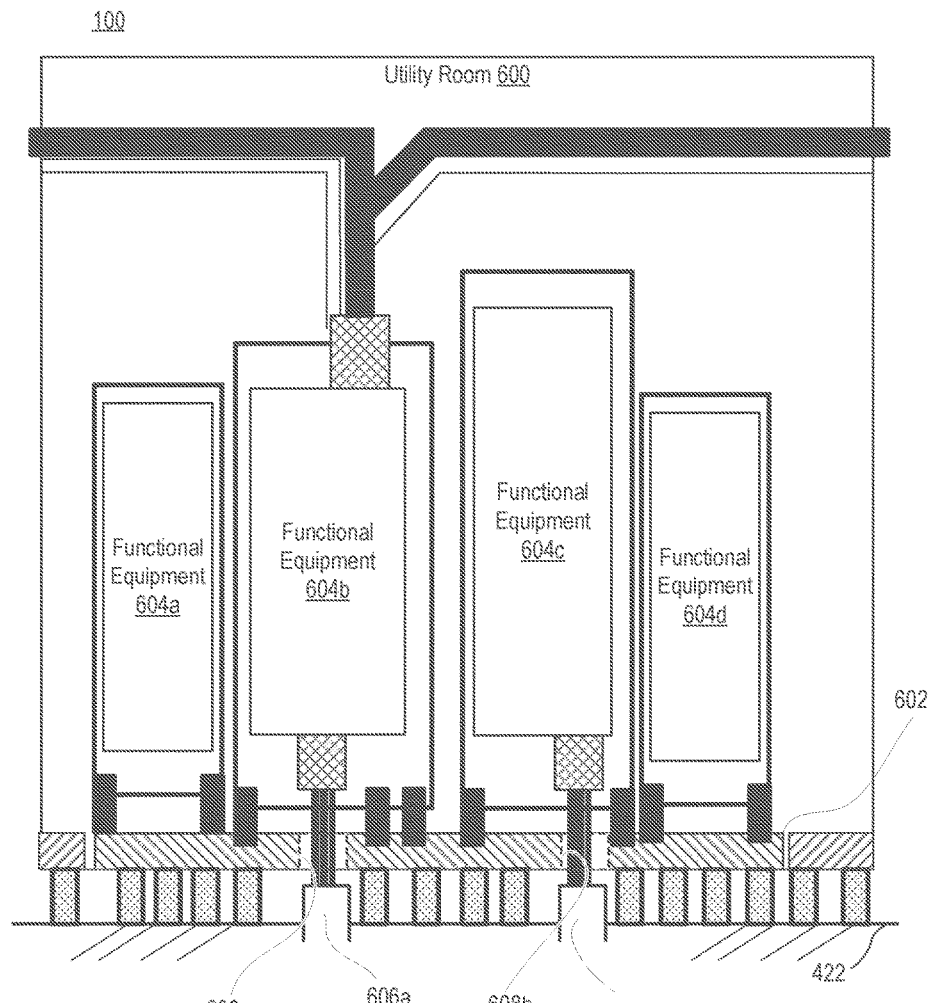
FIG. 6 is a cross sectional view illustrating a second example interface panel supporting four equipment cabinets, according to one or more embodiments.

FIG. 6 is a cross sectional view illustrating utility room 600 having second example interface panel 602 supporting equipment cabinets 604a-604d. Two adjacent input equipment cabinets 604b-604c are connected to substrate-installed conduits 606a-606b. Cabinets 604b-604c respectively are flanked by two other equipment cabinets 604a, 604d. Outputs and internal connections between equipment cabinets 604a-604d are omitted. Second example interface panel 602 provides conduit openings 608a, 608b that are accurately aligned with substrate-installed conduits 606a-606b.

Figure 7:
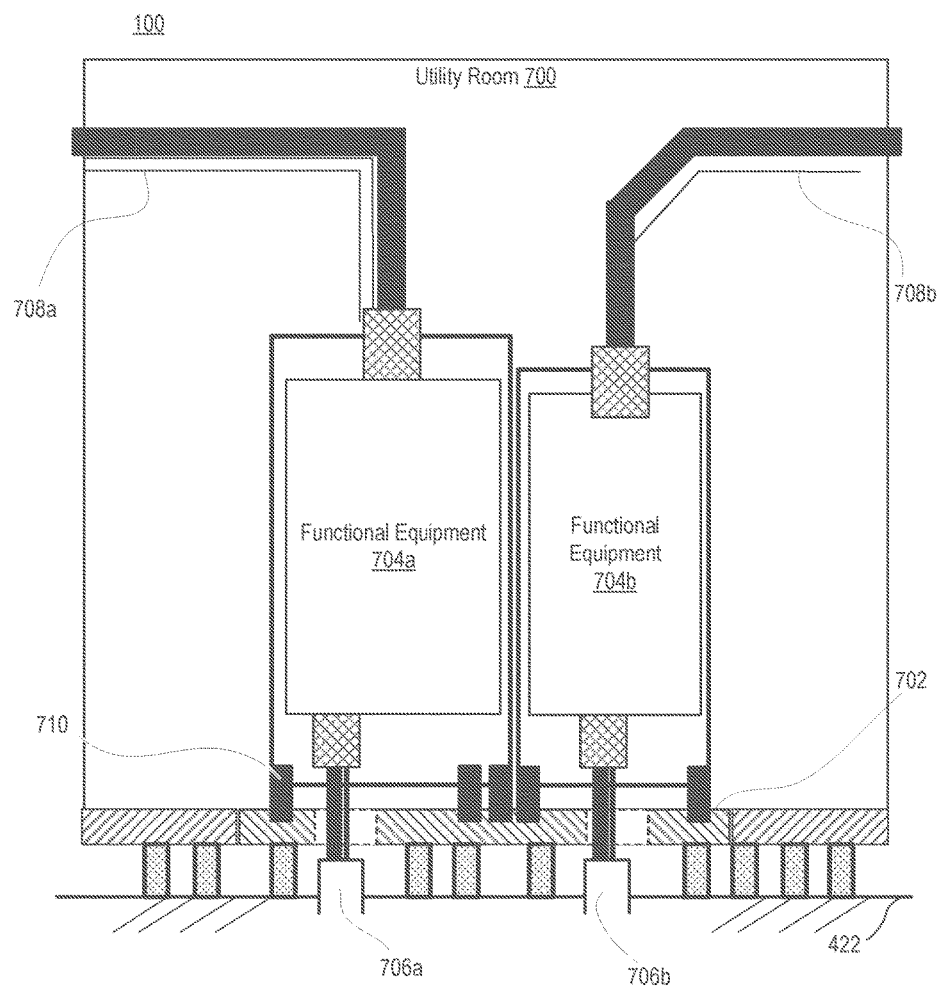
FIG. 7 is a cross sectional view illustrating a third example interface panel supporting two equipment cabinets, according to one or more embodiments.

FIG. 7 is a cross sectional view of utility room 700 having third example interface panel 702 supporting two input/output equipment cabinets 704a-704b. Each that cabinet 704a-704b connects via cables or other interconnects respectively below utility room 700 to substrate-installed conduits 706a-706b and above each cabinet 704a-704b to cable brackets 708a-708b.

Figure 8:
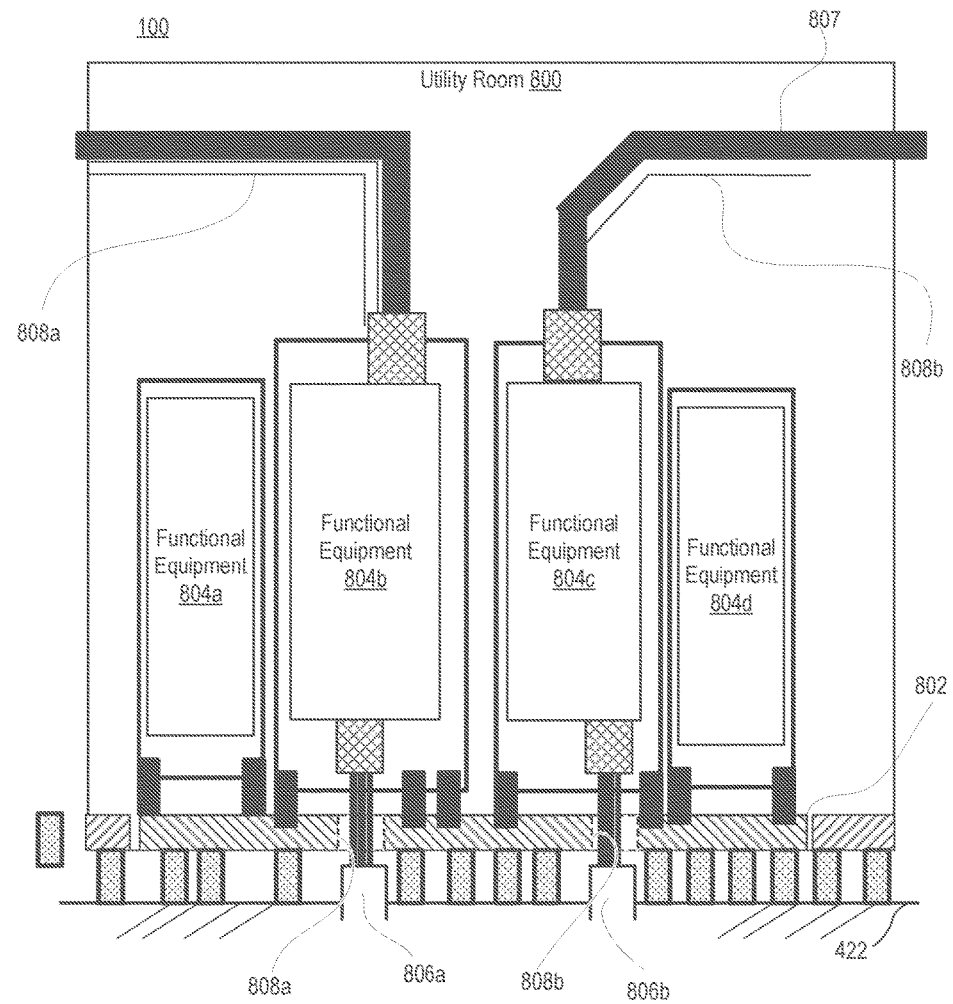
FIG. 8 is a cross sectional view illustrating a fourth example interface panel supporting four equipment cabinets, according to one or more embodiments.

FIG. 8 is a cross sectional view illustrating utility room 800 having fourth example interface panel 802 that support equipment cabinets 804a-804d. Input equipment cabinets 804a-804d connect via cables or other interconnects below utility room 800 respectively to substrate-installed conduits 806a-806b and are flanked by adjacent output equipment cabinets 804b-804c. Equipment cabinets 804b-804c are connected to cords, cables or other interconnects 807 that are supported by cable brackets 808a-808b.

FIGS. 9A-9E are top views respectively of the example interface panels 402, 502, 602, 702, 802 (FIGS. 4, 5A, and 6-8) that are interchangeably received in an interface panel opening 904 formed in a floor assembly 906. FIG. 9A is a top view of interface panel 402 having a cabinet guide 908 within which a unique array of attachment features 910 such as fastener holes are positioned. Conduit opening 912 is formed at a spatial location within cabinet guide 908 to locate conduit connections relative to interface panel 402. FIG. 9B is a top view of interface panel 502 having cabinet guides 918a-918b within which two unique array of attachment features 920a-920b such as fastener holes are positioned respectively. Conduit openings 922a-922b are formed at a spatial location within the respective cabinet guide 918a-918b to locate conduit connections relative to the interface panel 402. FIG. 9C is a top view of interface panel 602 having cabinet guide 928a-928d within which four unique array of attachment features 930a-930b such as fastener holes are positioned respectively. Conduit openings 932b-932c are formed at a spatial location within the respective cabinet guides 928b-918c to locate conduit connections relative to the interface panel 602. 402. FIG. 9D is a top view of interface panel 702 having cabinet guide 958a-958b within which two unique array of attachment features 960a-960b such as fastener holes are positioned respectively. Conduit openings 962a-962b are formed at a spatial location within the respective cabinet guide 958a-958b to locate conduit connections relative to the interface panel 702. FIG. 9E is a top view of interface panel 802 having cabinet guide 978a-978d within which four unique array of attachment features 980a-980b such as fastener holes are positioned respectively. Conduit openings 982b-982c are formed at a spatial location within the respective cabinet guides 978b-978c to locate conduit connections relative to the interface panel 802.

Figure 10:
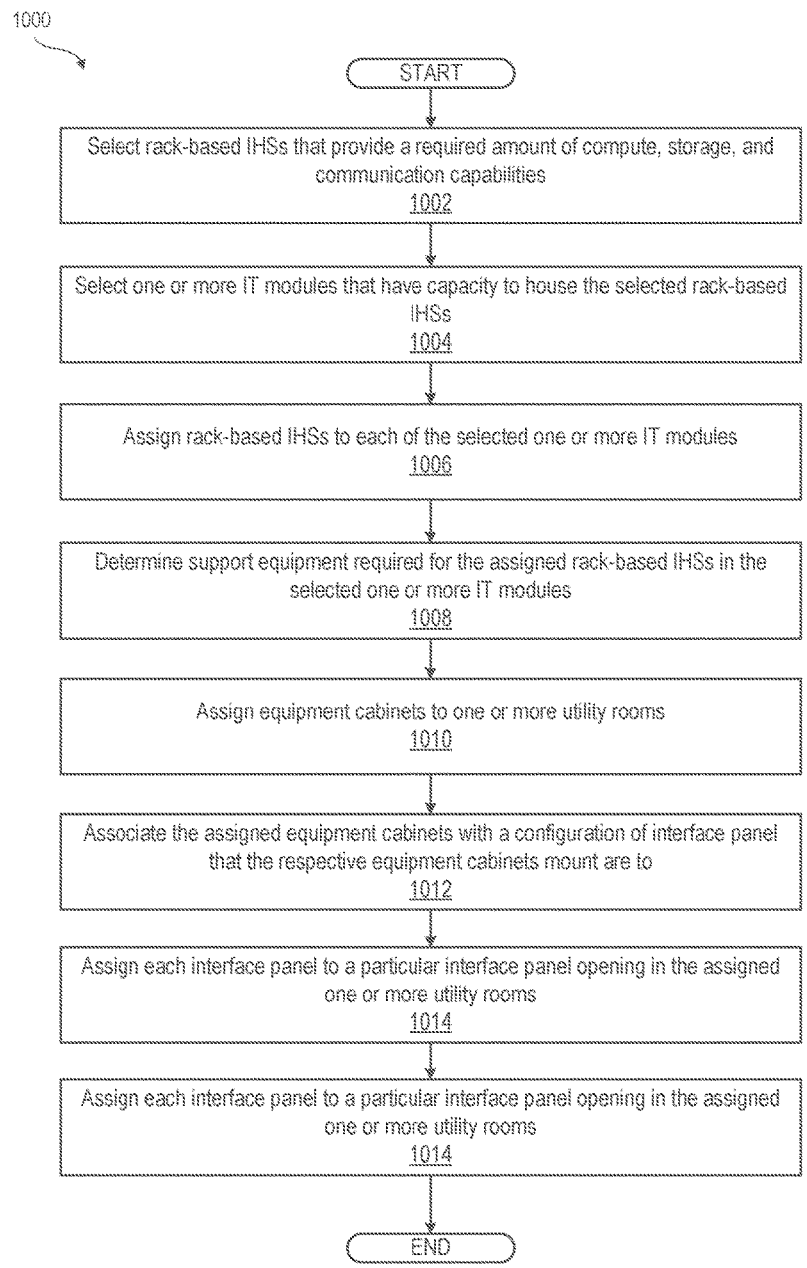
FIG. 10 is a flow diagram of a method of configuring a custom MDC for a deployed location, according to one or more embodiments.

FIG. 10 is a flow diagram of a method 1000 of configurating a custom MDC for a deployed location. In one or more embodiments, method 1000 begins with selecting rack-based IHSs that provide a required amount of compute, storage, and communication capabilities (block 1002). Method 1000 includes selecting one or more IT modules that have capacity to house the selected rack-based IHSs (block 1004). Method 1000 includes assigning rack-based IHSs to each of the selected one or more IT modules (block 1006). Method 1000 includes determining support equipment required for the assigned rack-based IHSs in the selected one or more IT modules (block 1008). Method 1000 includes assigning equipment cabinets to one or more utility rooms (block 1010). Method 1000 includes associating the assigned equipment cabinets with a configuration of interface panel that the respective equipment cabinets mount to (block 1012). Method 1000 includes assigning each interface panel to a particular interface panel opening in the assigned one or more utility rooms (block 1014). Method 1016 includes specifying a location for a substrate-installed conduit for a MDC pad assigned at the deployed location that corresponds with conduit openings provided in the assigned interface panels (block 1018). Then method 1000 ends.

In one or more embodiments, the interface panels are installed at an original equipment manufacturer (OEM) and the corresponding equipment cabinets are shipped to a deployed location for later installation after delivery of the utility room. In one or more embodiments, the interface panels and the corresponding equipment cabinets are installed at an OEM before delivery of the utility room at the deployed location. In one or more embodiments, the interface panels and the corresponding equipment cabinets are shipped to a deployed location for later installation after delivery of the utility room.

Figure 11A:
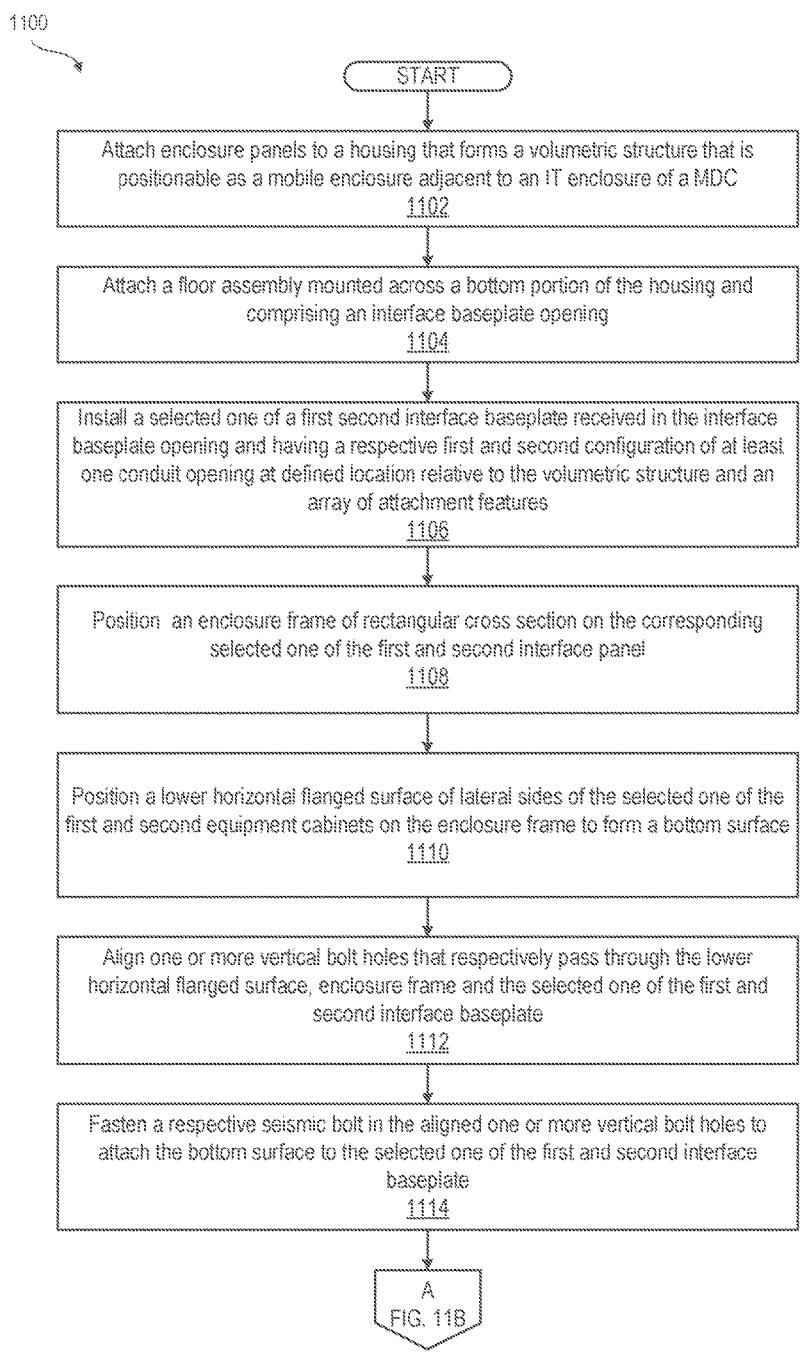
FIGS. 11A-11B are a flow diagram illustrating a method of assembling a utility room with configurable interface panels and equipment cabinets, according to one or more embodiments.
Figure 11B:
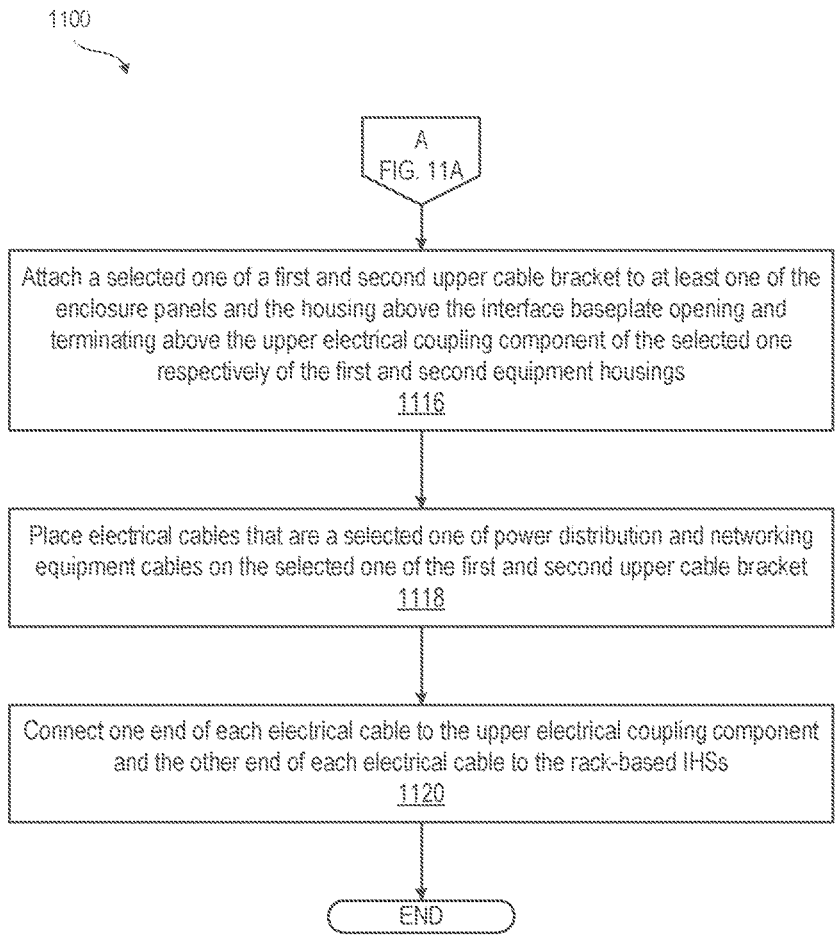

FIGS. 11A-11B provide a flow diagram illustrating a method 1100 of assembling a utility room with configurable interface panels and equipment cabinets. In one or more embodiments, method 1100 begins with an automated manufacturing and assembly system forming a volumetric structure with enclosure panels. In one embodiment, the enclosure panels are mounted on a housing. The volumetric structure is positionable as a mobile enclosure adjacent to an IT enclosure of a MDC (block 1102). Method 1100 includes attaching a floor assembly mounted across a bottom portion of the housing and comprising an interface panel opening (block 1104). Method 1100 includes installing a selected one of a first or second interface panel that is received in the interface panel opening. The first or second interface panels have a respective first and second configuration of at least one conduit opening at a defined location relative to the volumetric structure and an array of attachment features (block 1106). The first and second configurations are uniquely arranged to receive and correspond to a bottom surface of a respective first and second equipment cabinets. The predefined location corresponds to the one or more substrate-installed conduits of a MDC pad at the deployed location of the mobile utility room. The one or more substrate-installed conduits are prepositioned according to a selected one of a first and second placement that correspond respectively to the first and second configurations. Method 1100 includes positioning an enclosure frame on the corresponding selected one of the first and second interface panel (block 1108). In one or more embodiments, method 1100 includes positioning a lower horizontal flanged surface of lateral sides of the selected one of the first and second equipment cabinets on the enclosure frame to form a bottom surface (block 1110). In one or more embodiments, physical contacting surfaces of can force alignment and provide engaging surfaces. In one or more embodiments, method includes aligning one or more vertical bolt holes that respectively pass through the lower horizontal flanged surface, enclosure frame and the selected one of the first and second interface panel (block 1112).

In one or more embodiments, method 1100 includes: (i) drilling more than one vertical bolt hole through the first interface panel in a first two-dimensional pattern; and (ii) drilling more than one vertical bolt hole through the second interface panel in a second two-dimensional pattern that is different from the first two-dimensional pattern. The bottom surface of an equipment cabinet are drilled with one of the first and second two-dimensional pattern to correspond respectively with the first and second interface panels. Selecting one of the first and second interface panels thus assures that the corresponding one of the first and second equipment cabinets are also installed.

In one or more embodiments, method 1100 includes fastening a respective seismic bolt in the aligned one or more vertical bolt holes to attach the bottom surface to the selected one of the first and second interface panel (block 1114). Seismic bolts stretch without breaking in response to a seismic event, preventing toppling of the supported equipment cabinet. Method 1100 includes attaching a selected one of a first and second upper cable bracket to at least one of the enclosure panels and the housing. The selected one of the first and second cable bracket is located above the interface panel opening. The selected one of the first and second cable bracket terminates above the upper electrical coupling component of the selected one respectively of the first and second equipment cabinets (block 1116). Method 1100 includes supporting electrical cables on the selected one of the first and second upper cable bracket (block 1118). Examples of electrical cables include power distribution and networking cables. One end of each electrical cable is connected to the upper electrical coupling component (block 1120). Then method 1100 ends. After delivery of the configured utility room, the other end of each electrical cable is connected to the rack-based IHSs that are supported by the utility room.

In one or more embodiments, installation of equipment cabinets into the utility room occur at the deployed location.

Figure 9:
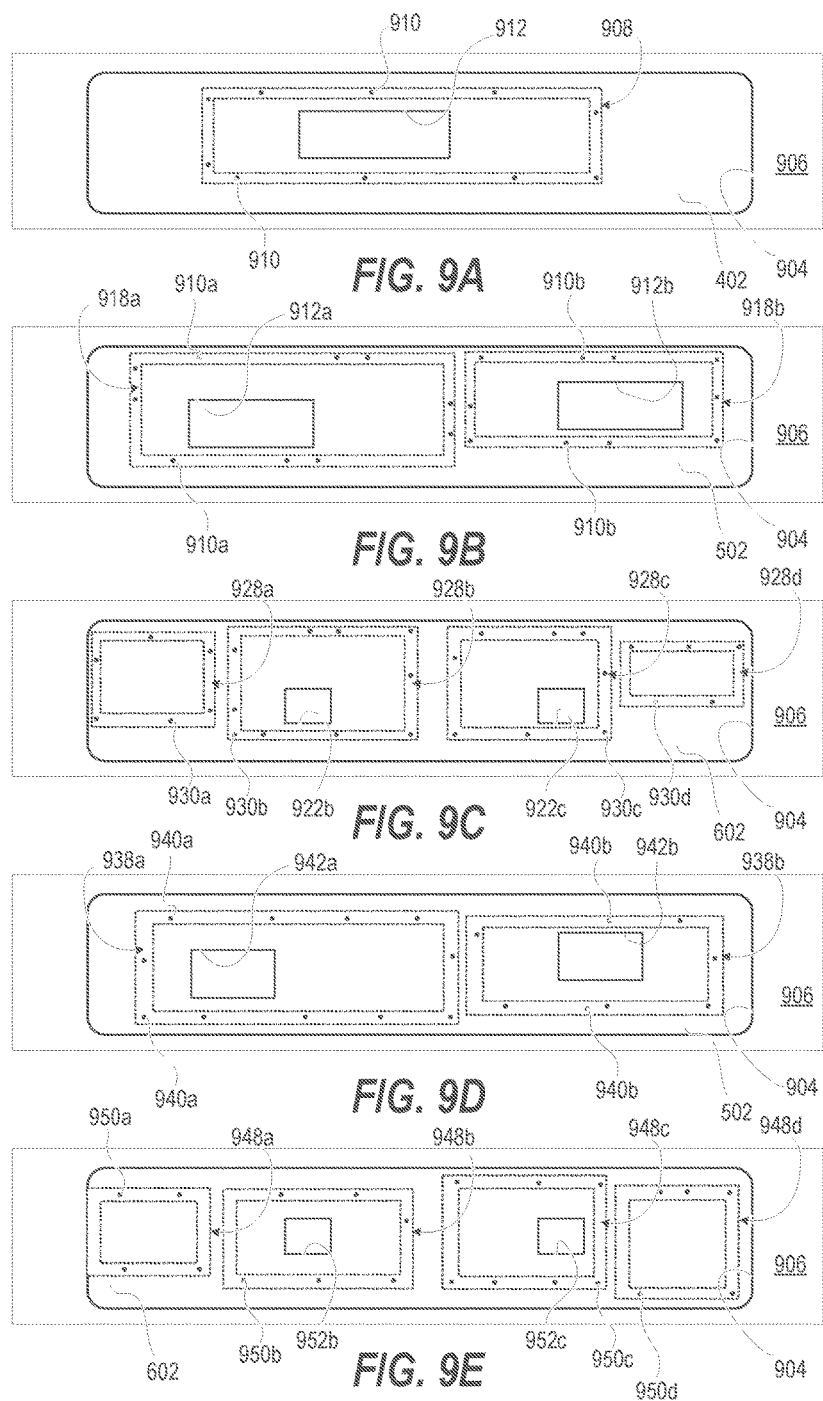
FIGS. 9A-9E are a top view diagrams of a utility room having a respective interface panel of FIGS. 4, 5A, and 6-8 interchangeably received in an interface panel opening, according to one or more embodiments.

In the above described flow chart of FIGS. 9 and 10A-10B, one or more of the methods may be embodied in an automated manufacturing and assembly controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A configurable modular data center (MDC) comprising:
   a volumetric structure;
   a floor assembly mounted across a bottom portion of the volumetric structure and comprising an interface panel opening capable of receiving a plurality of different configurations of interface panels;
   a first interface panel received in the interface panel opening and having a first configuration of at least one conduit opening and an array of attachment features, the at least one conduit opening aligning to a defined location relative to the bottom portion of the volumetric structure when the first interface panel is received in the interface panel opening; and
   a first equipment cabinet of more than one type of equipment cabinet that contains functional equipment that provide support for one or more information technology (IT) equipment, wherein:
      the first equipment cabinet positions a lower electrical coupling component of the functional equipment for connection to a substrate-installed conduit at a deployed location of the configurable MDC; and
      the first equipment cabinet has a bottom surface that engagingly corresponds to the array of attachment features of the first interface panel to align the lower electrical coupling component of the first equipment cabinet above to the at least one conduit opening of the first interface panel, wherein the first interface panel aligns the lower electrical coupling component at the predefined location corresponding to a substrate-installed conduit of a MDC pad at a deployed location of the configurable MDC, the one or more substrate-installed conduits prepositioned according to a first placement of more than one predefined placements.

2. The configurable MDC of claim 1, further comprising:
   a second interface panel having a second configuration of the more than one interface panel configuration and interchangeably replacing the first interface panel in the interface panel opening; and
   a second equipment cabinet of the more than one type of equipment cabinet of an IHS, the second equipment cabinet having a bottom surface that engagingly corresponds to the array of attachment features to the second interface panel to align the lower electrical coupling component when the configurable MDC is positioned on a second MDC pad having one or more substrate-installed conduits prepositioned according to a second placement of more than one predefined placements.

3. The configurable MDC of claim 2, further comprising an installed one of:
a first upper cable bracket attachable to the volumetric structure above the interface panel opening and support upper conduits coupled to an upper portion of the first equipment cabinet when mounted to the first interface panel; and
a second upper cable bracket attachable to the housing above the interface panel opening to support upper conduits coupled to an upper portion of the second equipment cabinet when mounted to the second interface panel.

4. The configurable MDC of claim 1, wherein the array of attachment features of the first interface panel comprises a first unique array positioned around a selected one of the at least one conduit opening that receives the first equipment cabinet and comprises a second unique array of attachment features that receives a second equipment cabinet that positions functional equipment for electrical connection for at least one of a bottom conduit opening and another upper cable bracket.

5. The configurable MDC of claim 1, wherein:
the first interface panel comprises: (i) a top plate; and (ii) structural supports attached beneath the top plate and laterally spaced from the at least one conduit opening to support and space apart the top plate from the first MDC pad;
the first equipment cabinet comprises lateral sides;
the bottom surface of the first equipment cabinet comprises: (i) a horizontal flanged surface; (ii) an enclosure frame supporting the horizontal flanged surface; and
the array of attachment features of the first interface panel that align the lower electrical coupling component comprise seismic bolts passing through aligned vertical bolt holes through the horizontal flanged surface, the enclosure frame and the top plate of the first interface panel with relative positions of the vertical bolt holes being uniquely configured for each type of equipment cabinet.

6. The configurable MDC of claim 1, wherein the MDC enclosure comprises: (i) a utility room that includes at least one of the first and second equipment cabinets that contain the selected one of power distribution and networking equipment; and (ii) an information technology module that contains the one or more rack-mounted IHS that are operatively coupled to the selected one of power distribution and networking equipment.

7. A modular utility room comprising:
a volumetric structure;
a floor assembly mounted across a bottom portion of the volumetric structure and comprising an interface panel opening that can selectively receive one of a plurality of different configurations of interface panels that each support a different configuration of information technology (IT) modules;
a selected one of a first and second equipment cabinet containing functional equipment having a lower electrical coupling component that connect to substrate-installed conduits below the volumetric structure and an upper electrical coupling component that connect to and support rack-based information handling systems (IHSs) in the IT enclosure; and
a selected one of a first and second interface panel received in the interface panel opening and having a respective first and second configuration of at least one conduit opening and an array of attachment features, the first and second configurations being uniquely arranged to receive and correspond to a bottom surface of the respective first and second equipment cabinets, positioning the lower electrical coupling component over one of the at least one conduit opening in alignment with a defined location relative to the volumetric structure, the predefined location corresponding to the one or more substrate-installed conduits of a MDC pad at the deployed location of the mobile utility room, the one or more substrate-installed conduits pre-positioned according to a selected one of a first and second placement that correspond respectively to the first and second configurations.

8. The modular utility room of claim 7, further comprising:
a selected one of a first and second upper cable bracket attached to at least one of the enclosure panels and the housing above the interface panel opening and terminating above the upper electrical coupling component of the selected one respectively of the first and second equipment cabinets; and
electrical cables supported by the selected one of the first and second upper cable bracket and connected between the upper electrical coupling component and the rack-based IHSs.

9. The modular utility room of claim 7, wherein:
the first and second interface panels comprise: (i) a top plate; and (ii) structural supports attached beneath the top plate and laterally spaced from the at least one conduit opening to support and space apart the top plate from the first MDC pad;
the first and second equipment cabinets comprise lateral sides;
the bottom surface of the first and second equipment cabinets comprises: (i) a horizontal flanged surface; and (ii) an enclosure frame supporting the horizontal flanged surface; and
the array of attachment features of the first and second interface panels that align the lower electrical coupling component comprise seismic bolts passing through aligned vertical bolt holes through the horizontal flanged surface, the enclosure frame and the top plate of the first interface panel with relative positions of the one or more vertical bolt holes being uniquely configured for the first and second equipment cabinets.

10. The modular utility room of claim 7, wherein the functional equipment contained in the first and second equipment cabinets comprise a selected one of power distribution and networking equipment.

11. The modular utility room of claim 7, further comprising:
three or more unique arrangements of one or more equipment cabinets; and
three or more interface panels that include the first and second interface panel and that are interchangeably received in the interface panel opening, each of the three or more interface panels having a respective configuration of at least one conduit opening and an array of attachment features that correspond to one of the three or more unique arrangements to receive and correspond to a bottom surface of the respective one or more equipment cabinets.

12. A method comprising:
attaching a floor assembly mounted across a bottom portion of a housing and, the floor assembly comprising an interface panel opening to form a volumetric structure of a modular data center (MDC);

installing a selected one of a first second interface panel received in the interface panel opening and having a respective first and second configuration of at least one conduit opening at defined location relative to the volumetric structure and an array of attachment features, the first and second configurations being uniquely arranged to receive and correspond to a bottom surface of a respective first and second equipment cabinets, the predefined location corresponding to the one or more substrate-installed conduits of a MDC pad at the deployed location of the mobile utility room, the one or more substrate-installed conduits prepositioned according to a selected one of a first and second placement that correspond respectively to the first and second configurations;

positioning the selected one of a first and second equipment cabinet on the corresponding selected one of the first and second interface panel to position a lower electrical coupling component of functional equipment contained in the selected one of the first and second equipment cabinet at the predefined location; and attaching the selected one of a first and second equipment cabinet to the array of attachment features that are arranged not to correspond to the other one of the first and second equipment cabinets.

13. The method of claim 12, further comprising:

attaching a selected one of a first and second upper cable bracket to at least one of the enclosure panels and the housing above the interface panel opening and terminating above the upper electrical coupling component of the selected one respectively of the first and second equipment cabinets;

placing electrical cables on the selected one of the first and second upper cable bracket; and connecting one end of each electrical cable to the upper electrical coupling component and the other end of each electrical cable to rack-based information handling systems (IHSs) contained in a selected at least one of: (i) the volumetric structure; and an adjacent information technology (IT) module of the MDC.

14. The method of claim 12, wherein attaching the selected one of a first and second equipment cabinet to the array of attachment features comprises:

positioning a lower horizontal flanged surface of lateral sides of the selected one of the first and second equipment cabinets on an enclosure frame to form the bottom surface;

aligning one or more vertical bolt holes that respectively pass through the lower horizontal flanged surface, enclosure frame and the selected one of the first and second interface panel; and fastening a respective seismic bolt in the aligned one or more vertical bolt holes to attach the bottom surface to the selected one of the first and second interface panel.

15. The method of claim 12, further comprising:

drilling more than one vertical bolt hole through the first interface panel in a first two-dimensional pattern; and drilling more than one vertical bolt hole through the second interface panel in a second two-dimensional pattern that is different from the first two-dimensional pattern.

16. The method of claim 12, wherein placing electrical cables on the selected one of the first and second upper cable bracket comprises placing a selected one of power distribution and networking equipment cables.

17. The method of claim 12, further comprising attaching enclosure panels to the housing that forms the volumetric structure that is positionable as a mobile enclosure adjacent to an information technology (IT) enclosure of the MDC.

* * * * *